US006696857B1

(12) United States Patent
Rana

(10) Patent No.: US 6,696,857 B1
(45) Date of Patent: Feb. 24, 2004

(54) HIGH SPEED CMOS DUAL MODULUS PRESCALER USING PULL DOWN TRANSISTOR

(75) Inventor: Ram Singh Rana, Singapore (SG)

(73) Assignee: Institute of Microelectronics, Singapore (SG)

(*) Notice: Subject to any disclaimer, the term of this patent is extended or adjusted under 35 U.S.C. 154(b) by 0 days.

(21) Appl. No.: 10/338,121

(22) Filed: Jan. 7, 2003

(51) Int. Cl.[7] ............................ G06F 7/38; H01H 61/00; H03K 21/00
(52) U.S. Cl. ............................ 326/46; 337/47; 337/48; 327/115
(58) Field of Search ................ 326/46, 93, 95, 326/98, 83; 337/47, 48; 327/115, 117, 202

(56) References Cited

U.S. PATENT DOCUMENTS

| | | | | |
|---|---|---|---|---|
| 4,606,059 A | * | 8/1986 | Oida | 377/47 |
| 5,818,293 A | * | 10/1998 | Brehmer et al. | 327/202 |
| 5,859,890 A | * | 1/1999 | Shurboff et al. | 377/48 |
| 5,889,437 A | * | 3/1999 | Lee | 331/16 |
| 5,930,322 A | * | 7/1999 | Yang et al. | 377/48 |
| 6,067,339 A | | 5/2000 | Knapp et al. | 377/47 |
| 6,157,693 A | | 12/2000 | Jayaraman | 377/47 |
| 6,219,397 B1 | | 4/2001 | Park | 375/376 |
| 6,369,623 B1 | | 4/2002 | Heinen | 327/117 |
| 6,411,669 B1 | * | 6/2002 | Kim | 377/48 |
| 6,462,595 B1 | * | 10/2002 | Hsu et al. | 327/215 |
| 2003/0141912 A1 | * | 7/2003 | Sudjian | 327/208 |

OTHER PUBLICATIONS

Craninckz et al., "A 1.75 –GHz/3–V Dual–Modulus Divide–by–128/129 Prescaler in 0.7–μm CMOS", IEEE Journal of Solid–State Circuits, vol. 31, No. 7, Jul. 1996, pp. 890–897.

Tang et al., "A High–Speed Low–Power Divide–by–15/16 Dual Modulus Prescaler in 0.6μm CMOS", Analog Integrated Circuits and Signal Processing, 28, 195–200, no date, and month, 2001, Kluwer Academic Publ., pp. 195–200.

Chang et al., "A 1.2 GHz CMOS Dual–Modulus Prescaler Using New Dynamic D–Type Flip–Flops", IEEE Jrnl. of Solid State Circuits, vol. 31, No. 5, May 1996, pp. 749–752.

Foroudi et al., "CMOS High–Speed Dual–Modulus Frequency Divider for RF Frequency Synthesis", IEEE Jrnl. of Solid–State Circuits, vol. 30, No. 2, Feb. 1995, pp. 93–100.

Yang et al., "A CMOS Dual–Modulus Prescaler Based on a New Change Sharing Free D–Flip–Flop", IEEE 2001, pp. 276–280.

* cited by examiner

Primary Examiner—Michael Tokar
Assistant Examiner—Linh Van Nguyen
(74) Attorney, Agent, or Firm—George O. Saile; Stephen B. Ackerman

(57) ABSTRACT

The present invention provides a circuit and a method for high speed prescaler circuits which utilize pull-down transistors in the critical feedback path. This invention contains a high speed CMOS dual modulus prescaler circuit made up of data or D-flip flops connected serially where the flip-flop positive output Q of stage N is connected to the D-input of the N+1 flip-flop stage. It is also made up of a pull-down field effect transistor. The invention has a clock input which has a frequency known as a circuit input frequency, Fin. The output of this prescaler circuit has an output frequency, Fout. The frequency division which results from this prescaler circuit is a divide by [2 to the power (n+2)] minus 1 if a mode signal equals 1 as opposed to a divide by [2 to the power (n+2)] counter, which results when the mode signal is low.

40 Claims, 2 Drawing Sheets

HIGH SPEED CMOS DUAL MODULUS PRESCALER USING PULL DOWN TRANSISTOR

BACKGROUND OF THE INVENTION

1. Field of the Invention

The present invention generally relates to the design of high-speed prescaler circuits. More particularly, this invention relates to a circuit and a method for creating high-speed CMOS dual modulus prescalers using pull-down transistors.

2. Description of the Prior Art

There have been few attempts in the past for the CMOS design of high-speed dual modulus prescalers where low power consumption and high speed have been considered the stringent requirements. The speed of these prescalers gets further degraded due to additional loads from gates and flip-flops to achieve high divided-by-value. In general, the speed of the prescalers consisting of high-speed synchronous counters is limited by the delay of feedback critical paths. In the prior art, in most cases, logic gates are used in the feedback critical/paths.

U.S. Pat. No. 6,369,623 B1 (Heinen) "Circuit Configuration for a Frequency Divider" describes a frequency divider with a prescaler which includes two dual modulus dividers.

U.S. Pat. No. 6,067,339 (Knapp et al.) "Frequency Divider with Lower Power Consumption" describes a dual modulus prescaler using flip-flops.

U.S. Pat. No. 6,219,397 (Park) "Low Phase Noise CMOS Fractional-N Frequency Synthesizer for Wireless Communications" describes a frequency synthesizer with a prescaler which includes a two modulus prescaler having at least one flip flop.

U.S. Pat. No. 6,157,693 (Jayaraman) "Low Voltage Dual-Modulus Prescaler Circuit Using Merged Pseudo-Differential Logic" describes a dual modulus prescaler using pseudo differential logic.

(Yang, et al.) "A CMOS Dual-Modulus Prescaler Based on a New Charge Sharing Free D-Flip Flop" shows a dual modulus divide by 128/129 prescaler which uses a new charge sharing dynamic D-Flip Flop for high speed and low power operation. (Craninckz, et al.) "A 1.75-GHz/3-V Dual Modulus Divided by 128/129 Prescaler in 0.7 um CMOS shows a dual modulus divide by 128/129 prescaler which uses synchronous high speed for only one divided by 2 flip flop. Synchronous means the clock goes to each flip-flop. The remainder of the prescaler uses an asynchronous divider.

(Tang, et al.) "A High-Speed Low-Power Divide-by-15/16 Dual Modulus Prescaler in 0.6 um CMOS" describes a synchronous counter which means that the clock goes to each flip-flop. The remainder of the prescaler uses an asynchronous divider. This prescaler does not have the NAND gate between stages.

(Chang, et al.) "A 1.2 GHz CMOS Dual-Modulus Prescaler Using New Dynamic D-Type Flip-Flops" describes a high speed prescaler which contains a synchronous counter and an asynchronous counter.

(Foroudi, et al.) "CMOS High-Speed Dual-Modulus Frequency Divider for RF Frequency Synthesis" describes a circuit which utilizes level-triggered differential logic to produce a low-power, high frequency circuit function.

SUMMARY OF THE INVENTION

It is therefore an object of the present invention to provide a circuit and a method for high-speed prescaler circuits. It is further an object of this invention to provide high speed CMOS circuitry for dual modulus prescalers which utilize pull-down transistors.

The objects of this invention are achieved by a high speed CMOS dual modulus prescaler circuit made up of data or D-flip flops connected serially where the flip-flop positive output Q of stage N is connected to the D-input of the N+1 flip-flop stage. It is also made up of a P-channel metal oxide semiconductor field effect transistor, PMOS FET whose gate is connected to the negative output of a last stage of the serial chain of D-flip flops and an N-channel metal oxide semiconductor field effect transistor, NMOS FET whose drain is connected to the PMOS FET. It is also made up of a two input NAND gate whose one input is the positive output of the last flip-flop of the serial chain of D-flip flops and whose second input is a mode control signal and whose output drives the gate of the NMOS FET. A second NMOS FET has a gate which is attached to the drain of the first NMOS FET, and a second or final D-flip flop whose data input comes from the positive output of the previous D-flip flop.

The high speed CMOS dual modulus prescaler circuit has a first D-flip flop whose clock input has a frequency known as a circuit input frequency, Fin. The output of this prescaler circuit has an output frequency, Fout. The frequency division which results from this prescaler circuit is a divide by [2 to the power (n+2)] minus 1 if the mode signal 250 equals 1 as opposed to a divide by [2 to the power (n+2)] counter, which results when the mode signal 250 is low.

The above and other objects, features and advantages of the present invention will be better understood from the following detailed description taken in conjunction with the accompanying drawings.

DESCRIPTION OF THE PREFERRED EMBODIMENT

Figure 1:
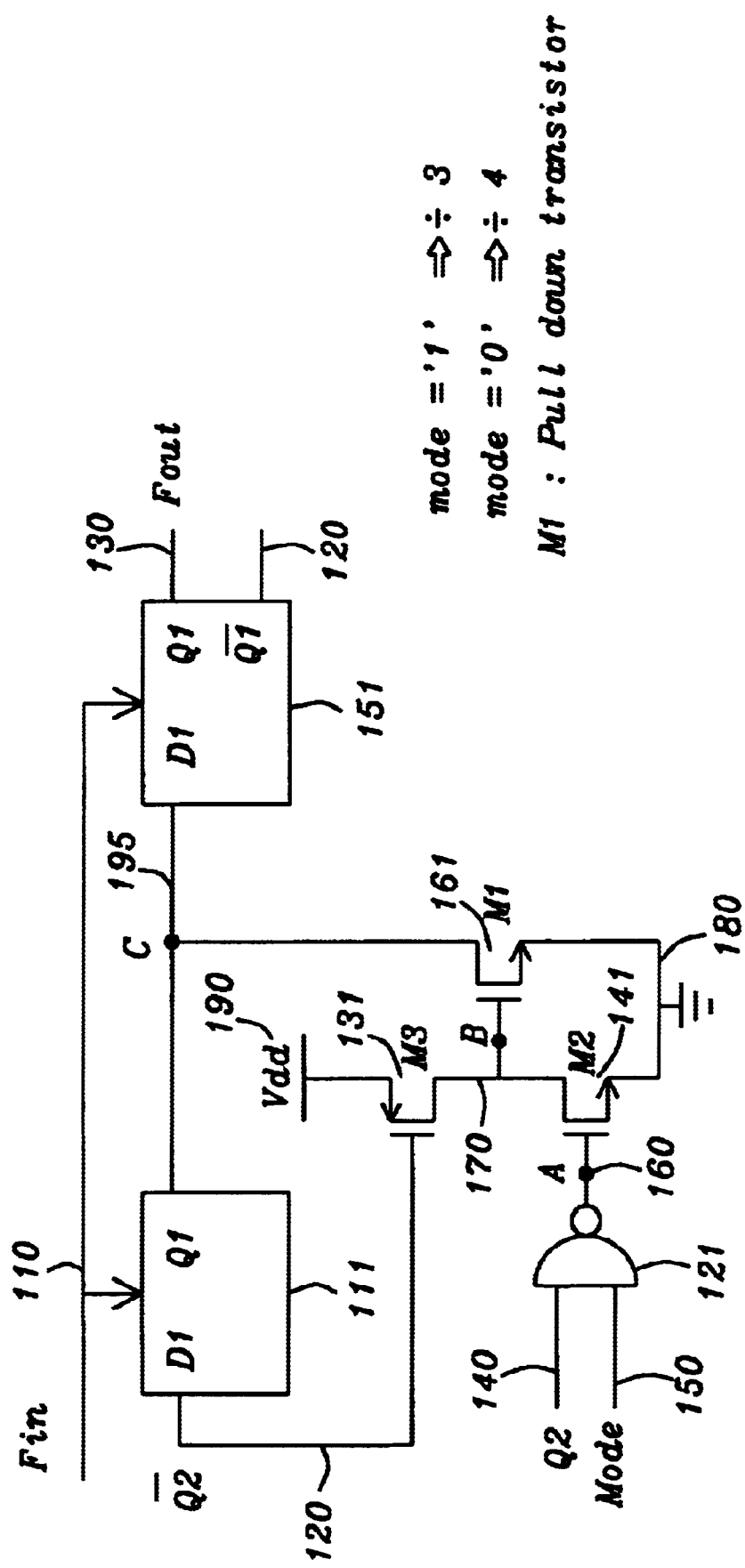
FIG. 1 shows the main embodiment of this invention with a specific implementation of a divide by ¾ dual modulus prescaler.

FIG. 1 shows a main embodiment of this invention. It shows the specific case of the dual modulus or dual modes of divide by 3 and divide by 4. The figure shows two D-flip flops 111, 151. Both of these flip-flops have a clock signal attached. The clock is labeled Fin 110 to denote that the frequency of this clock input signal is equal to Fin.

The data input of the first flip-flop 111 is attached to the feedback signal, which comes from the negative output Q2N 120 from the output of the second flip-flop 151. The output of the second flip-flop 151 is labeled Fout 130 to denote that the frequency of the second flip-flop 151 has a frequency equal to Fout. This output frequency, Fout 130 will be equal to Fin/3 or Fin/4 depending on the logical bit setting of the mode signal 150. If mode 150 equals 1, Fout 130 equals Fin/3. If mode 150 equals 0, Fout 130 equals Fin/4.

In FIG. 1, the two input NAND gate 121 has two inputs, which are Q2 140 and the mode signal 150. The output of the two-input NAND circuit 121 is 160. This signal 160 goes to the gate of a first NMOS FET device M2 141. The source of NMOS FET goes to ground 180. The drain of this NMOS FET M2 141 is connected to the drain of a PMOS FET device M3 131. The drain of NMOS FET M2 141 is also connected to the gate of a second NMOS FET device M1 161.

The source of the PMOS FET device M3 131 is connected to the Vdd power supply 190. The gate of PMOS device M3, 131 is connected to the negative output Q2N, 120 of the second flip flop 151. The gate of the PMOS FET M3 131 is also connected to the data input of the first flip-flop 111.

The drain of the second NMOS FET device M1, 161 is connected to Node C, 195, which is connected to the positive output of the first flip-flop 111 and the data input of the second flip-flop 151. The source of the NMOS FET device 161 is connected to ground 180.

When the mode signal 150 is high and the positive output 130 of the second flip-flop is high the output 160 of the two input NAND 121 is low. This causes the voltage at the gate of NMOS FET device M2, 141 to be low.

This results in the charge up of Node B, 170. This eventually causes the second NMOS FET M1, 161 to turn ON. This device, M1 161 pulls down Node C, 195. The result is a divide by 3 counter as opposed to a divide by 4 counter, which results when the mode signal 150 is low.

When the mode signal 150 is low, the output 160 of the two input NAND 121 is high. This causes NMOS FET M2 to turn ON. This discharges Node B, 170 causing NMOS FET device M1 161 to turn OFF. With device M1 161 OFF, there is no pull-down of node C 195. Therefore, D-flip-flops 111 & 151 will operate as a normal divide by 4 counter.

A summary of the key points of the operation of the embodiment in FIG. 1 is as follows. The critical path is from the Q2N output 120 of the second flip-flop 151 to node C195 through M3 (131) and through M1 (161). This means the delay in critical path is rather small and the load from critical path to high frequency node Q2N 120 is also comparably low. This structure results in high speed. Moreover, this configuration needs a lesser number of flip-flops and logic gates compared to the prior art. This results in lower power dissipation than the prior art. Next, in FIG. 2, the general implementation case is shown. This is facilitated by the addition of a "2 to the power n" asynchronous counter 271.

Figure 2:
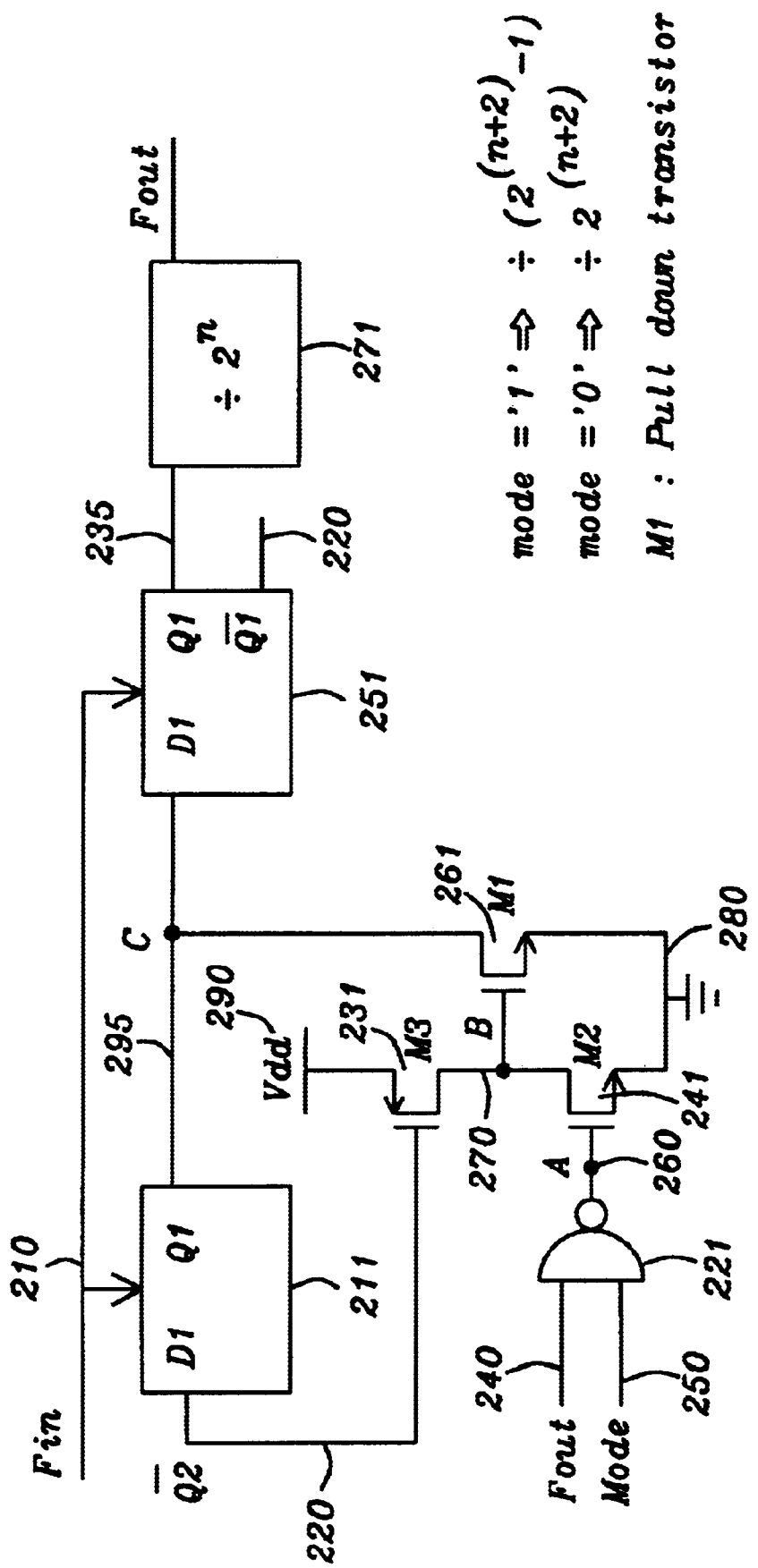
FIG. 2 shows the main embodiment of this invention with a general implementation of a divide by [2 to the power (n+2)] minus 1 and [2 to the power (n+2)].

FIG. 2 shows a more general presentation of the main embodiment of this invention. It shows the general case of the dual modulus or dual modes of divide by [2 to the (n+2) power] minus 1 and divide by [2 to the (n+2) power]. The figure shows two D-flip flops 211, 251. Both of these flip-flops have a clock signal attached. The clock is labeled Fin 210 to denote that the frequency of this clock input signal is equal to Fin.

The data input of the first flip-flop 211 is attached to the feedback signal, which comes from the negative output QN2 220 from the output of the second flip-flop 251. The output of the second flip-flop 251 is 235. The output of the second flip-flop goes to another block 271 labeled "divide by 2 to the power n". Block 271 represents a divide by "2 to the power n" asynchronous counter. The output of block 271 is an Fout signal 230 which is a signal with a frequency of Fout. This output frequency, Fout 230 will be equal to FIN divided by 2 to the power (n+2) if the mode signal 250 is 0. It results in a prescaler, which has Fout 230 equal to FIN divided by [2 to the power (n+2)] minus 1 if the mode signal 250 equals 1.

In FIG. 2, the two input NAND gate 221 has two inputs, which are Q2 240 and the mode signal 250. The output of the two-input NAND circuit 221 is 260. This signal 260 goes to the gate of a first NMOS FET device M2 241. The source of NMOS FET goes to ground 280. The drain of this NMOS FET M2 241 is connected to the drain of a PMOS FET device M3 231. The drain of NMOS FET M2 241 is also connected to the gate of a second NMOS FET device M1 261. The source of the PMOS FET device M3 231 is connected to the Vdd power supply 290. The gate of PMOS device M3, 231 is connected to the negative output Q2N, 220 of the second flip flop 251. The gate of the PMOS FET M3 231 is also connected to the data input of the first flip-flop 211. The drain of the second NMOS FET device M1, 261 is connected to Node C, 295, which is connected to the positive output of the first flip-flop 211 and the data input of the second flip-flop 251. The source of the NMOS FET device 261 is connected to ground 280.

When the mode signal 250 is high and the positive output 235 of the second flip-flop is high the output 260 of the two input NAND 221 is low. This causes the voltage at the gate of NMOS FET device M2, 241 to be low. This results in the charge up of Node B, 270. This eventually causes the second NMOS FET M1, 261 to turn ON. This device, M1 261 pulls down Node C, 295. The result is a divide by [2 to the power (n+2)] minus 1 if the mode signal 250 equals 1 as opposed to a divide by [2 to the power (n+2)] counter, which results when the mode signal 250 is low.

When the mode signal 250 is low, the output 260 of the two-input NAND 221 is high. This causes NMOS FET M2 to turn ON. This discharges Node B, 270 causing NMOS FET device M1 261 to turn OFF. With device M1 261 OFF, there is no pull-down of node C 295. Therefore, D-flip-flops 211 & 251 will operate as a normal divide by 4 counter.

This invention provides a circuit and method for creating prescalers that have the following advantages over the prior art. This circuit and method of this invention provides for higher speed and higher divide-by values than the prior art. These advantages are achievable, due to the simplicity of the pull-transistor in the critical feedback path of the prescaler. Similarly, this invention affords lower power dissipation than the prior art due to the simplicity of the small number of devices such as the pull-transistor in the critical feedback path of the prescaler. Finally, this invention is easier to build and integrate into integrated circuitry due to the simplicity of the pull-transistor in the critical feedback path of the prescaler.

While the invention has been described in terms of the preferred embodiments, those skilled in the art will recognize that various changes in form and details may be made without departing from the spirit and scope of the invention.

What is claimed is:

1. A high speed CMOS Dual Modulus prescaler circuit comprising:
    data or D-flip flops connected serially in a chain wherein a flip-flop positive output Q of stage N is connected to a D-input of an N+1 flip-flop stage,
    a P-channel metal oxide semiconductor field effect transistor, PMOS FET whose gate is connected to a negative output of a last stage of said serial chain of D-flip flops,
    an N-channel metal oxide semiconductor field effect transistor, NMOS FET whose drain is connected to said PMOS FET,
    a two input NAND gate whose one input is a positive output of said last flip-flop of said serial chain of D-flip flops and whose second input is a node control signal and whose output drives said gate of said NMOS FET,
    a second NMOS FET whose gate is attached to a drain of said first NMOS FET, and
    a second or final D-flip flop whose data input comes from a positive output of said previous D-flip flop.

2. The high speed CMOS Dual Modulus prescaler circuit of claim 1 wherein said D-flip flops include a first D-flip flop whose clock input has a frequency known as a circuit input frequency.

3. The high speed CMOS Dual Modulus prescaler circuit of claim 1 wherein said first D-flip flop has a data or D-input, which is fed from a negative output of a last flip-flop in said serial chain of flip-flops.

4. The high speed CMOS Dual Modulus prescaler circuit of claim 1 wherein said first flip-flop has a positive output, which feeds an input of a second or final D-flip-flop.

5. The high speed CMOS Dual Modulus prescaler circuit of claim 1 wherein said second or final D-flip-flop has a data or D-input, which is fed from said positive input of said first stage flip-flop.

6. The high speed CMOS Dual Modulus prescaler circuit of claim 1 wherein said second or final flip-flop has a negative output, which feeds said data or D-input of said first flip-flop of said serial chain.

7. The high speed CMOS Dual Modulus prescaler circuit of claim 1 wherein said second or final flip-flop has a positive output, which becomes a primary output signal whose frequency is some fraction of said input clock frequency.

8. The high speed CMOS Dual Modulus prescaler circuit of claim 1 wherein said PMOS FET has its source connected to a supply voltage Vdd, its drain connected to said drain of said NMOS FET, and its gate is connected to a negative output of said last flip flop stage and also to said D-input of said first D-flip flop.

9. The high speed CMOS Dual Modulus prescaler circuit of claim 1 wherein said first NMOS FET has its drain connected to said drain of said PMOS FET device, its source is connected to ground, and its gate is connected to said output of said two-input NAND gate.

10. The high speed CMOS Dual Modulus prescaler circuit of claim 1 wherein said second NMOS FET has its drain connected to said positive output of said first D-flip-flop, its source connected to ground, and its gate is connected to said drain of said first NMOS FET.

11. The high speed CMOS Dual Modulus prescaler circuit of claim 1 wherein said second NMOS FET is used as a pull-down transistor to cause the switching between modes of frequency division.

12. The high speed CMOS Dual Modulus prescaler circuit of claim 1 wherein said two input NAND has an output, which drives said gate of said first NMOS FET.

13. The high speed CMOS Dual Modulus prescaler circuit of claim 1 wherein said positive output of said second frequency, Fout which is a fraction of said circuit input clock frequency.

14. The high speed CMOS Dual Modulus prescaler circuit of claim 1 wherein said positive output of said second or final D-flip flop stage is one of two inputs to said two-input NAND.

15. The high speed CMOS Dual Modulus prescaler circuit of claim 1 wherein said mode control signal equal to one will produce an output signal whose frequency is ⅓ of the frequency of said input clock.

16. The high speed CMOS Dual Modulus prescaler circuit of claim 1 wherein said mode control signal equal to zero will produce an output signal whose frequency is ¼ of said frequency of said input clock.

17. The high speed CMOS Dual Modulus prescaler circuit of claim 1 wherein a divide by $2^n$ circuit block is added serially to an output of said serial flip-flop chain.

18. The high speed CMOS Dual Modulus prescaler circuit of claim 1 wherein said input of said divide $2^n$ circuit block comes from said positive output of said last D-flip flop stage.

19. The high speed CMOS Dual Modulus prescaler circuit of claim 1 wherein said mode control signal will cause said circuit to produce a signal whose output frequency is said input frequency divided by "2 to the power (n+2)" minus 1 if said mode signal is a 1.

20. The high speed CMOS Dual Modulus prescaler circuit of claim 1 wherein said mode control signal will cause said circuit to produce a signal whose output frequency is said input frequency divided by "2 to the power (n+2)" if said mode signal is a 0.

21. A CMOS Dual Modulus method for prescaling an electrical signal comprising the steps of:

providing data or D-flip flops connected serially wherein a flip-flop positive output Q of stage N is connected to a D-input of an N+1 flip-flop stage, providing a P-channel metal oxide semiconductor field effect transistor, PMOS FET whose gate is connected to a negative output of a last stage of said serial chain of D-flip flops, providing an N-channel metal oxide semiconductor field effect transistor, NMOS FET whose drain is connected to said PMOS FET, providing a two-input NAND gate whose one input is a positive output of said last flip-flop of said serial chain of D-flip flops and whose second input is a node control signal and whose output drives said gate of said NMOS FET, providing a second NMOS FET whose gate is attached to a drain of said first NMOS FET, and providing a second or final D-flip flop whose data input comes from a positive output of said previous D-flip flop.

22. The CMOS Dual Modulus method for prescaling an electrical signal of claim 21 wherein said D-flip flops include a first D-flip flop whose clock input has a frequency known as a circuit input frequency.

23. The CMOS Dual Modulus method for prescaling an electrical signal of claim 21 wherein said first D-flip flop has a data or D-input, which is fed from a negative output of a last flip-flop in said serial chain of flip-flops.

24. The CMOS Dual Modulus method for prescaling an electrical signal of claim 21 wherein said first flip-flop has a positive output, which feeds an input of a second or final D-flip-flop.

25. The CMOS Dual Modulus method for prescaling an electrical signal of claim 21 wherein said second or final D-flip-flop has a data or D-input, which is fed from the positive input of said first stage flip-flop.

26. The CMOS Dual Modulus method for prescaling an electrical signal of claim 21 wherein said second or final flip-flop has a negative output, which feeds said data or D-input of said first flip-flop of said serial chain.

27. The CMOS Dual Modulus method for prescaling an electrical signal of claim 21 wherein said second or final flip-flop has a positive output, which becomes a primary output signal whose frequency is some fraction of said input clock frequency.

28. The CMOS Dual Modulus method for prescaling an electrical signal of claim 21 wherein said PMOS FET has its source connected to the supply voltage Vdd, its drain connected to said drain of said NMOS FET, and its gate is connected to a negative output of said last flip flop stage and also to said D-input of said first D-flip flop.

29. The CMOS Dual Modulus method for prescaling an electrical signal of claim 21 wherein said first NMOS FET has its drain connected to said drain of said PMOS FET device, its source is connected to ground, and its gate is connected to said output of said two-input NAND gate.

30. The CMOS Dual Modulus method for prescaling an electrical signal of claim 21 wherein said second NMOS FET has its drain connected to said positive output of said first D-flip-flop, its source connected to ground, and its gate is connected to said drain of said first NMOS FET.

31. The CMOS Dual Modulus method for prescaling an electrical signal of claim 21 wherein said second NMOS FET is used as a pull-down transistor to cause the switching between the two modes of frequency division.

32. The CMOS Dual Modulus method for prescaling an electrical signal of claim 21 wherein said two-input NAND has an output, which drives said gate of said first NMOS FET.

33. The CMOS Dual Modulus method for prescaling an electrical signal of claim 21 wherein said positive output of said second frequency, four which is a fraction of said circuit input clock frequency.

34. The CMOS Dual Modulus method for prescaling an electrical signal of claim 21 wherein said positive output of said second or final D-flip flop stage is an input of said two-input NAND.

35. The CMOS Dual Modulus method for prescaling an electrical signal of claim 21 wherein said mode control signal equal to one will produce an output signal whose frequency is ⅓ of the frequency of said input clock.

36. The CMOS Dual Modulus method for prescaling an electrical signal of claim 21 wherein said mode control signal equal to zero will produce an output signal whose frequency is ¼ of the frequency of said input clock.

37. The CMOS Dual Modulus method for prescaling an electrical signal of claim 21 wherein a divide by $2^n$ circuit block is added serially to an output of said serial flip-flop chain.

38. The CMOS Dual Modulus method for prescaling an electrical signal of claim 21 wherein said input of said divide $2^n$ circuit block comes from said positive output of said last D-flip flop stage.

39. The CMOS Dual Modulus method for prescaling an electrical signal of claim 21 wherein said mode control signal will cause said circuit to produce a signal whose output frequency is an input frequency divided by "2 to the power (n+2)" minus 1 if said mode signal is a 1.

40. The CMOS Dual Modulus method for prescaling an electrical signal of claim 21 wherein said mode control signal will cause said circuit to produce a signal whose output frequency is the input frequency divided by "2 to the power (n+2)" if said mode signal is a 0.

* * * * *